United States Patent
Sugino

(10) Patent No.: US 9,493,874 B2
(45) Date of Patent: Nov. 15, 2016

(54) DISTRIBUTION OF GAS OVER A SEMICONDUCTOR WAFER IN BATCH PROCESSING

(71) Applicant: Spansion LLC, Sunnyvale, CA (US)

(72) Inventor: Rinji Sugino, San Jose, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 13/678,025

(22) Filed: Nov. 15, 2012

(65) Prior Publication Data

US 2014/0134332 A1    May 15, 2014

(51) Int. Cl.
*C23C 16/455* (2006.01)
*C23C 16/458* (2006.01)
*H01L 21/673* (2006.01)

(52) U.S. Cl.
CPC ....... *C23C 16/45563* (2013.01); *C23C 16/455* (2013.01); *C23C 16/4583* (2013.01); *C23C 16/4584* (2013.01); *C23C 16/45578* (2013.01); *C23C 16/45587* (2013.01); *C23C 16/45591* (2013.01); *H01L 21/67303* (2013.01)

(58) Field of Classification Search
None
See application file for complete search history.

(56) References Cited

U.S. PATENT DOCUMENTS

| | | | |
|---|---|---|---|
| 4,082,865 A * | 4/1978 | Ban et al. | 117/98 |
| 4,499,853 A * | 2/1985 | Miller | 118/725 |
| 5,925,188 A * | 7/1999 | Oh | C23C 16/24 |
| | | | 118/715 |
| 6,352,593 B1 * | 3/2002 | Brors et al. | 118/724 |
| 6,663,025 B1 * | 12/2003 | Halsey et al. | 118/715 |
| 6,821,563 B2 | 11/2004 | Yudovsky | |
| 7,081,271 B2 | 7/2006 | Chung et al. | |
| 7,235,138 B2 * | 6/2007 | Zheng | C23C 16/45546 |
| | | | 118/725 |
| 7,407,892 B2 * | 8/2008 | Weimer | C23C 16/45546 |
| | | | 257/E21.16 |
| 7,828,898 B2 * | 11/2010 | Maeda | C23C 16/45512 |
| | | | 118/715 |
| 7,998,878 B2 | 8/2011 | Levy et al. | |
| 8,043,432 B2 | 10/2011 | Dip | |

(Continued)

FOREIGN PATENT DOCUMENTS

DE    102004004858 A1 *  8/2005
EP         2407577 A2 *  1/2012

(Continued)

OTHER PUBLICATIONS

International Search Report and Written Opinion of the International Searching Authority for International Application No. PCT/US2013/070057, mailed Feb. 26, 2014.

(Continued)

*Primary Examiner* — Rakesh Dhingra
*Assistant Examiner* — Stanislav Antolin

(57) ABSTRACT

A method and apparatus to evenly distribute gas over a wafer in batch processing. Several techniques are disclosed, such as, but not limited to, angling an injector to distribute gas towards a proximate edge of the wafer, and/or reducing the amount of overlap in the center of the wafer of gas from subsequent gas injections.

13 Claims, 19 Drawing Sheets

(56) References Cited

U.S. PATENT DOCUMENTS

| | | | |
|---|---|---|---|
| 8,461,062 B2* | 6/2013 | Sakai | C23C 16/405 118/696 |
| 8,529,700 B2* | 9/2013 | Carcia | B65H 18/00 118/500 |
| 8,551,249 B2* | 10/2013 | Carcia | B65H 18/00 118/500 |
| 8,828,141 B2* | 9/2014 | Sakai | C23C 16/405 118/696 |
| 2002/0127508 A1* | 9/2002 | Jin et al. | 432/93 |
| 2003/0041801 A1* | 3/2003 | Hehmann | 118/715 |
| 2003/0049372 A1* | 3/2003 | Cook et al. | 427/248.1 |
| 2003/0111013 A1* | 6/2003 | Oosterlaken et al. | 118/715 |
| 2005/0100669 A1* | 5/2005 | Kools et al. | 427/255.23 |
| 2006/0062914 A1* | 3/2006 | Garg et al. | 118/723 R |
| 2006/0258157 A1* | 11/2006 | Weimer | C23C 16/45546 438/685 |
| 2007/0000444 A1* | 1/2007 | Shimizu | 118/720 |
| 2007/0010072 A1* | 1/2007 | Bailey et al. | 438/478 |
| 2007/0056950 A1* | 3/2007 | Yudovsky et al. | 219/406 |
| 2007/0059128 A1* | 3/2007 | Yudovsky et al. | 414/217 |
| 2007/0074663 A1* | 4/2007 | Brailove et al. | 118/719 |
| 2007/0084406 A1* | 4/2007 | Yudovsky et al. | 118/724 |
| 2007/0084408 A1* | 4/2007 | Yudovsky et al. | 118/725 |
| 2007/0163716 A1* | 7/2007 | Hsiao et al. | 156/345.26 |
| 2008/0245301 A1* | 10/2008 | Weimer | C23C 16/45546 118/724 |
| 2009/0029561 A1* | 1/2009 | Fukuda | C23C 16/45578 438/758 |
| 2009/0088001 A1* | 4/2009 | Nakagawa | 118/715 |
| 2009/0191717 A1* | 7/2009 | Kim | C23C 16/45546 438/758 |
| 2009/0197424 A1* | 8/2009 | Sakai | C23C 16/405 438/758 |
| 2009/0223448 A1* | 9/2009 | Sakai | C23C 16/405 118/715 |
| 2010/0248423 A1 | 9/2010 | Nelson et al. | |
| 2011/0048327 A1* | 3/2011 | Carcia | B65H 18/00 118/728 |
| 2011/0048328 A1* | 3/2011 | Carcia | B65H 18/00 118/728 |
| 2011/0185970 A1* | 8/2011 | Surthi | 118/704 |
| 2011/0253049 A1* | 10/2011 | Fukuda | C23C 16/45578 118/728 |
| 2011/0305835 A1 | 12/2011 | Bertram, Jr. et al. | |
| 2012/0003396 A1 | 1/2012 | Maas et al. | |
| 2012/0027953 A1 | 2/2012 | Lee | |
| 2012/0076929 A1 | 3/2012 | Fedorovskaya et al. | |
| 2012/0103256 A1 | 5/2012 | Hasebe | |
| 2012/0103260 A1 | 5/2012 | Park et al. | |
| 2012/0118233 A1 | 5/2012 | Werkhoven | |
| 2012/0122318 A1* | 5/2012 | Sakai | C23C 16/405 438/758 |
| 2012/0125258 A1 | 5/2012 | Lee | |
| 2012/0171815 A1* | 7/2012 | Maeng | C23C 16/303 438/107 |
| 2012/0186573 A1 | 7/2012 | Jdria et al. | |
| 2012/0192792 A1 | 8/2012 | Mahajani et al. | |
| 2012/0315394 A1* | 12/2012 | Ito | 118/696 |

FOREIGN PATENT DOCUMENTS

| | | |
|---|---|---|
| JP | 04-287912 | 10/1992 |
| JP | 2000331939 A * | 11/2000 |
| JP | 2010-103544 A | 5/2010 |
| KR | 10-2004-0003715 A | 1/2004 |
| KR | 10-0481548 B1 | 4/2005 |
| KR | 10-2011-0007507 A | 1/2011 |
| WO | WO 2011115250 A1 * | 9/2011 |

OTHER PUBLICATIONS

English language abstract for Korean Patent Application Publication No. KR-10-2011-0007507-A (listed on the accompanying form PTO/SB/08A as document FP1).

English language abstract for Korean Patent Application Publication No. KR-10-2004-0003715-A (listed on the accompanying form PTO/SB/08A as document FP2).

English language abstract for Japanese Patent Application Publication No. JP-2010-103544-A (listed on the accompanying form PTO/SB/08A as document FP3).

English language abstract for Korean Patent Application Publication No. KR-10-0481548-B1 (listed on the accompanying form PTO/SB/08A as document FP4).

Sachs, E., et al., "Modeling and control of an epitaxial silicon deposition process with step disturbances," *1991 IEEE/SEMI Advanced Semiconductor Manufacturing Conference*, pp. 104-107, Institute of Electrical and Electronics Engineers, United States (1991).

English language Abstract of Japanese Patent Publication No. 04-287912, Japanese Patent Office, Patent & Utility Model Gazette DB, Patent Abstracts of Japan, (1992) (listed on the accompanying form PTO/SB/08A as document FP1).

* cited by examiner

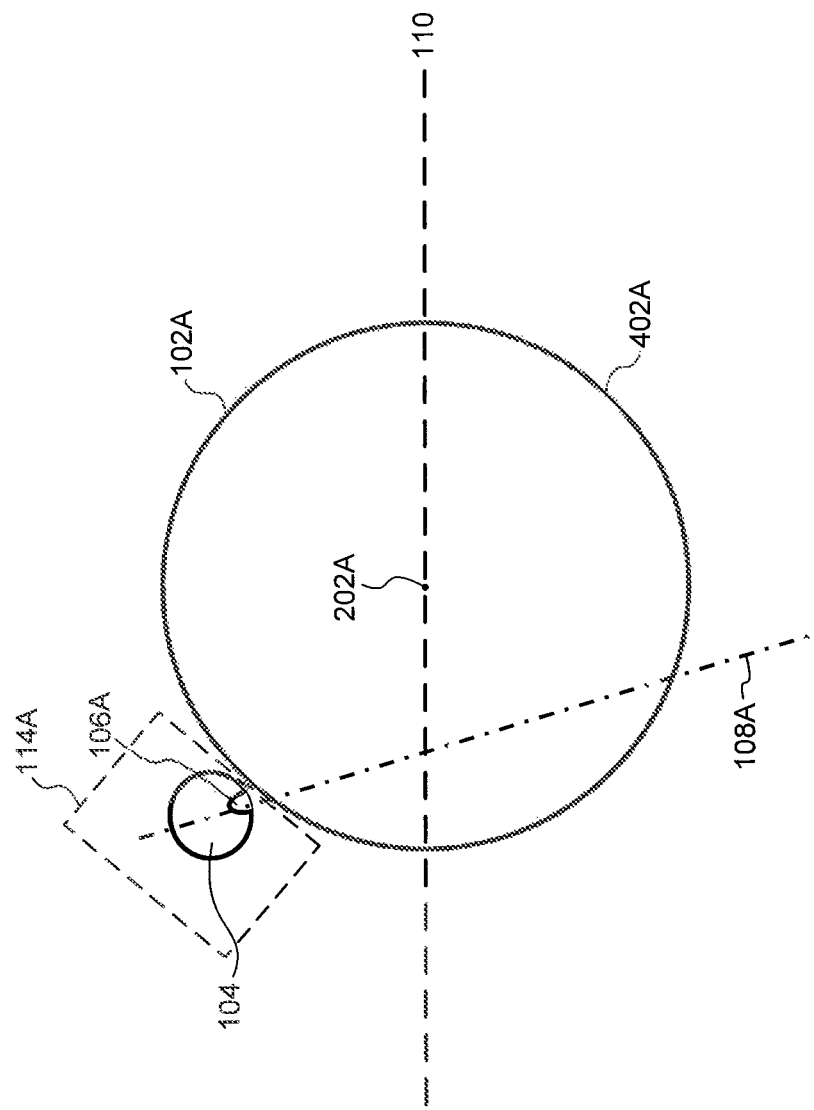

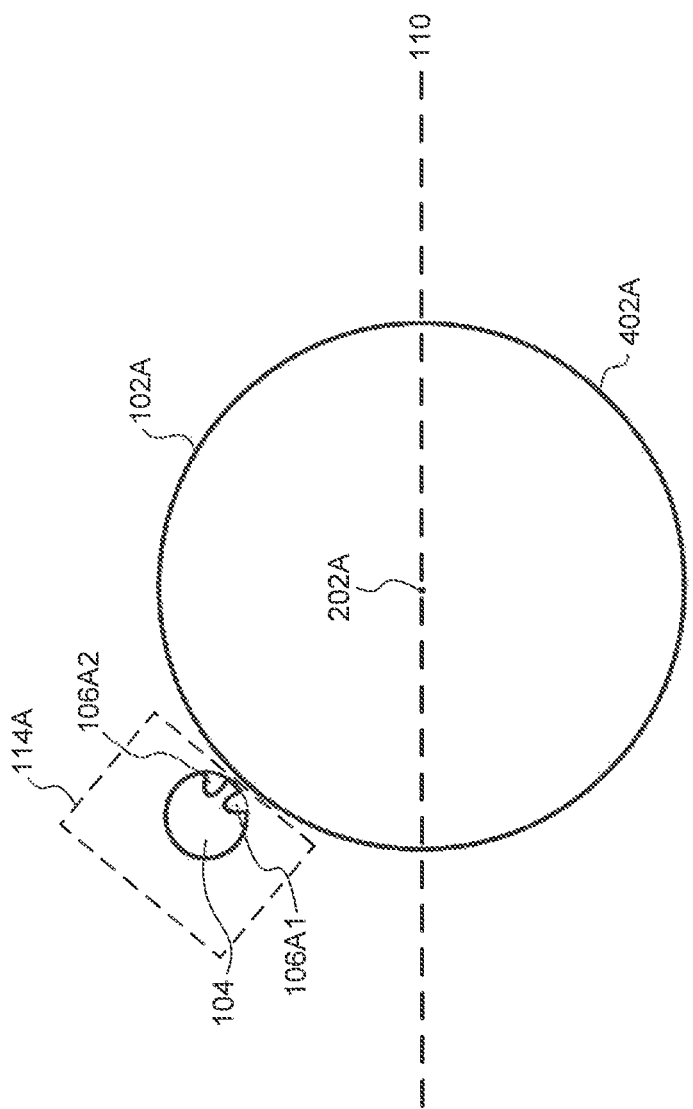

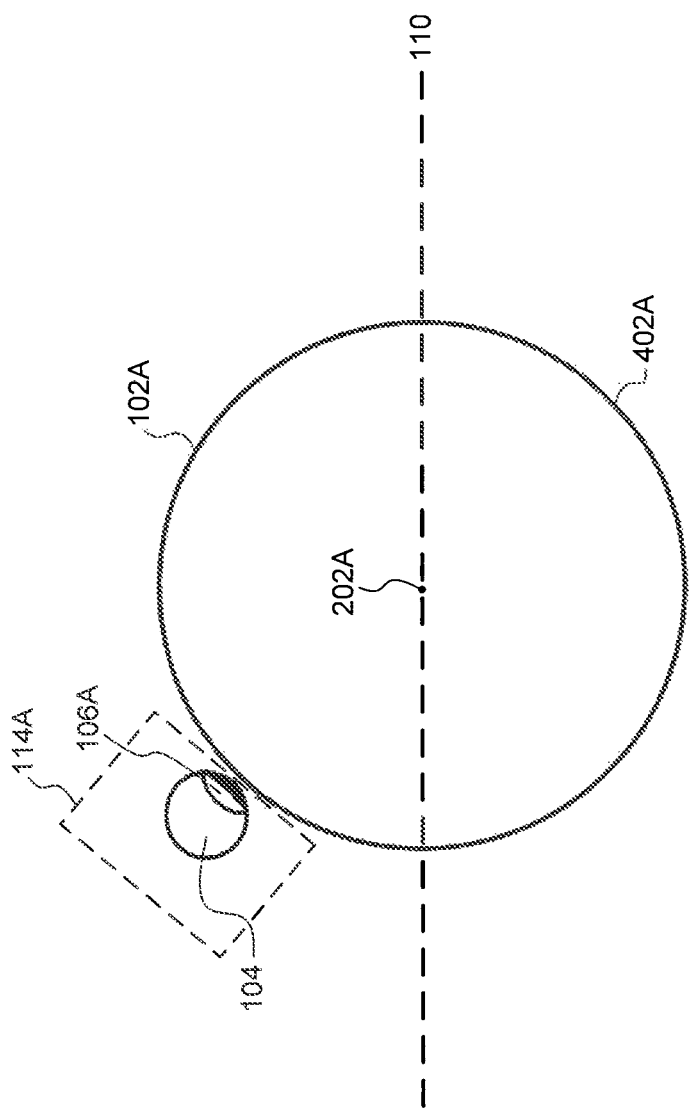

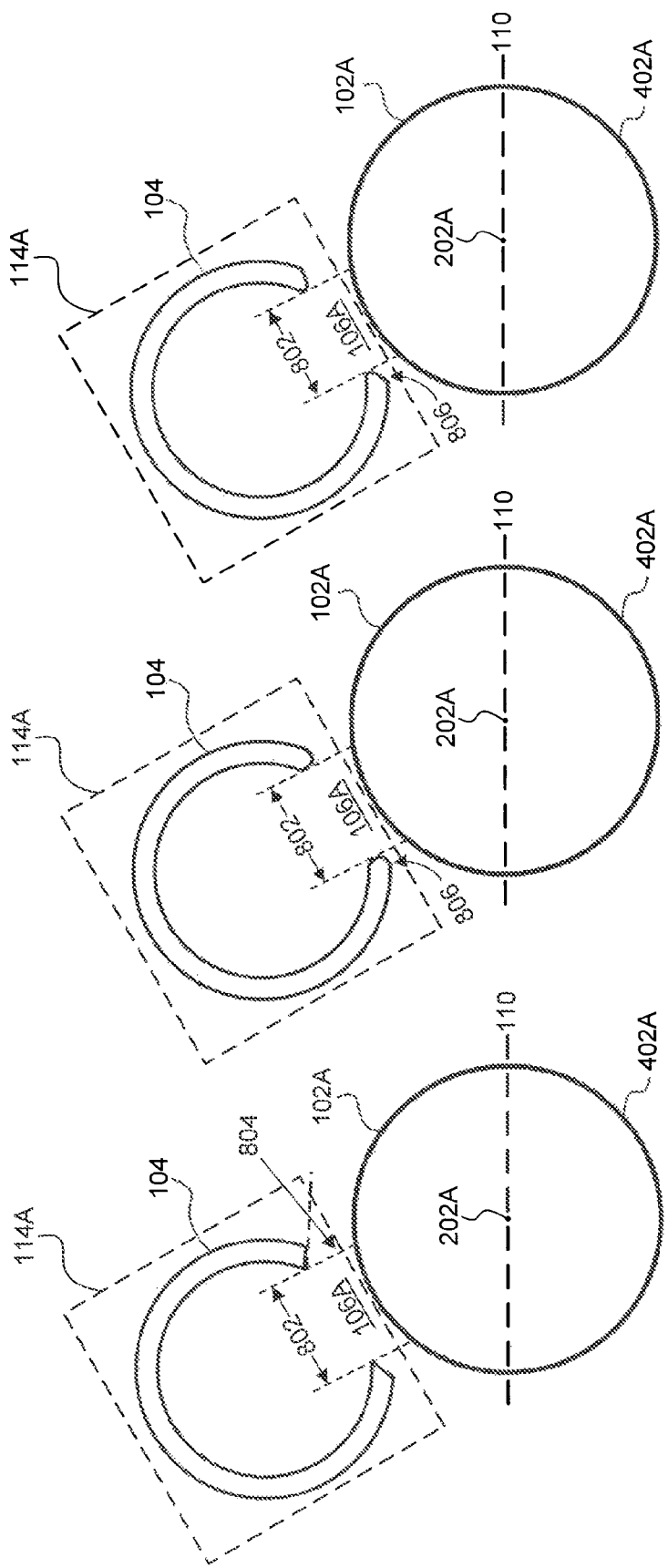

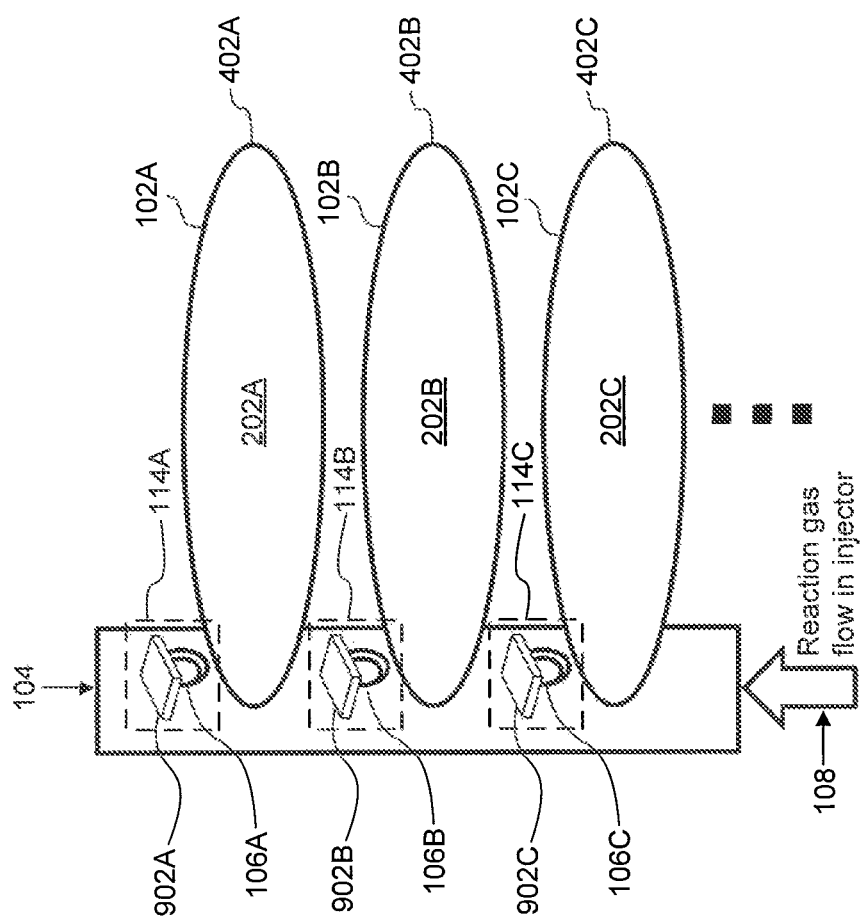

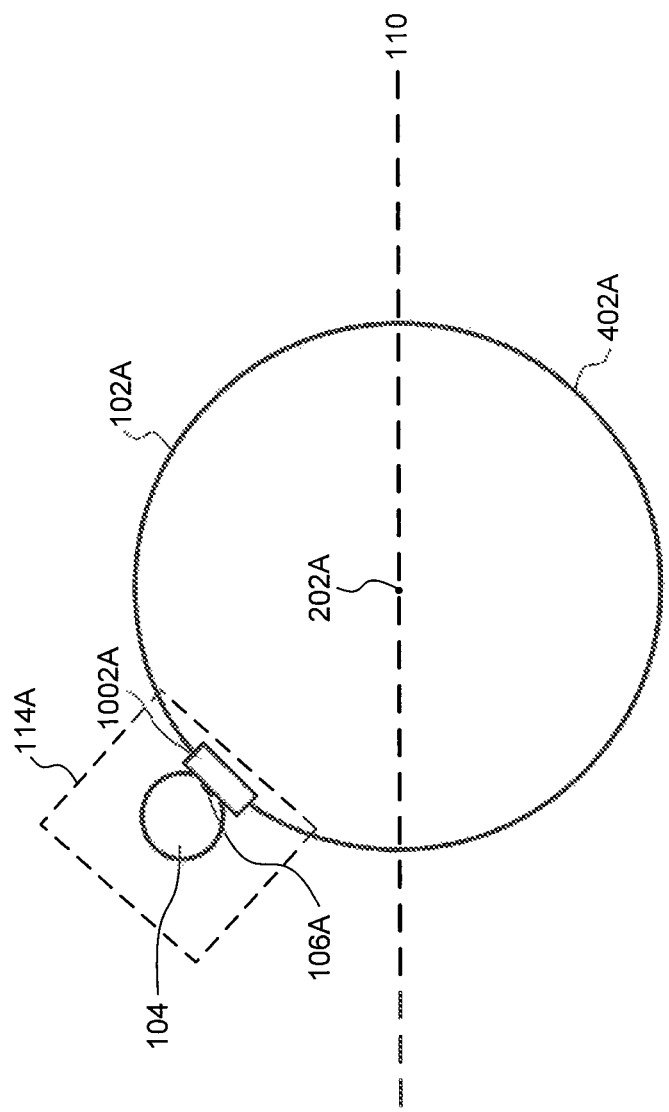

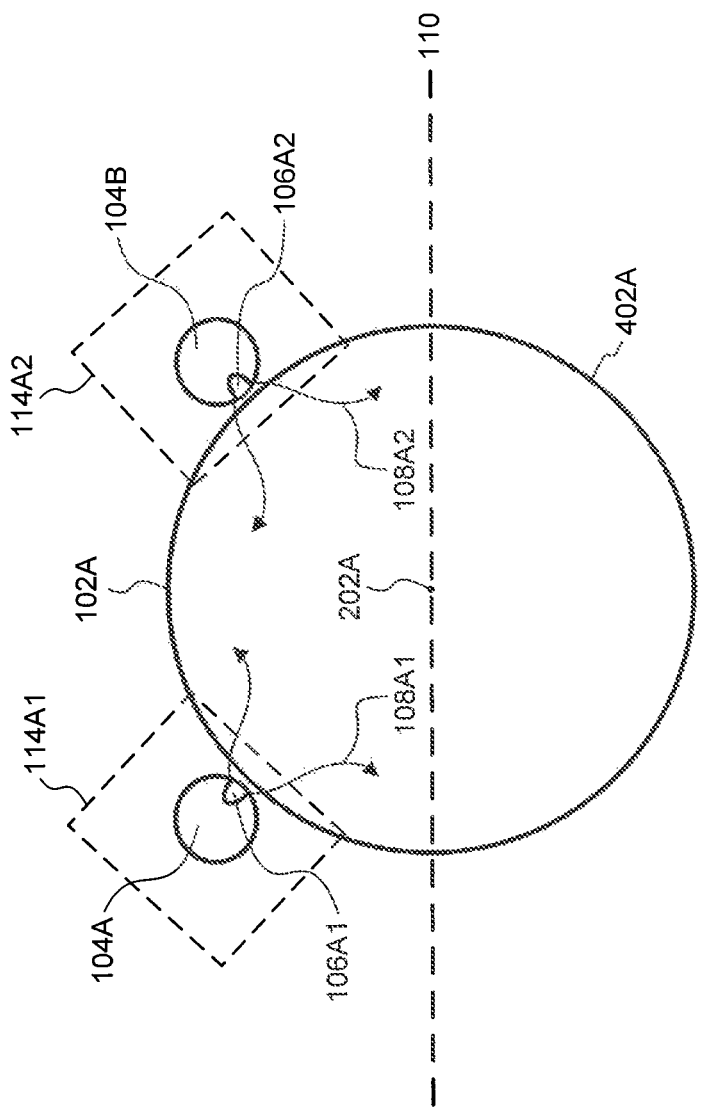

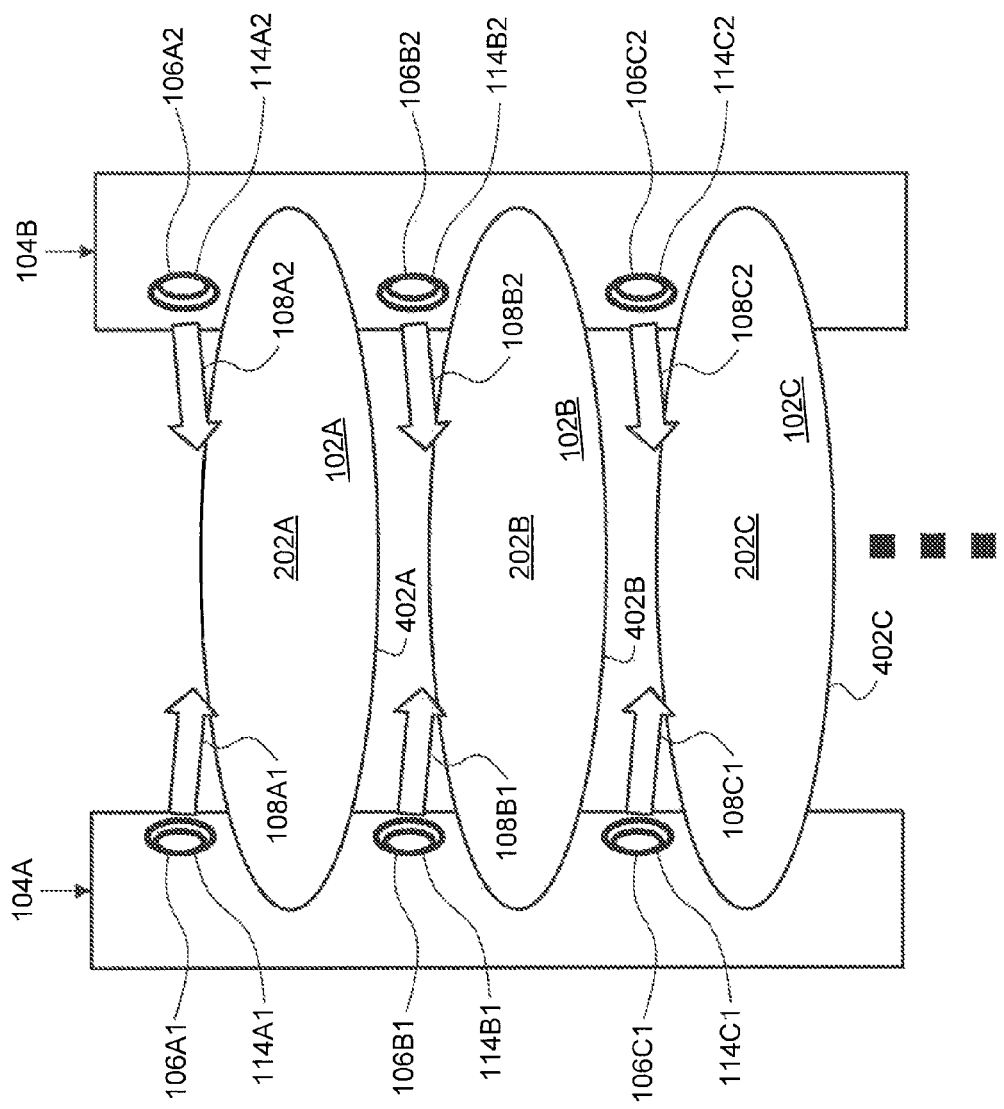

DISTRIBUTION OF GAS OVER A SEMICONDUCTOR WAFER IN BATCH PROCESSING

BACKGROUND

1. Technical Field

This disclosure generally relates to wafer manufacturing, such as wafer manufacturing involving thin film deposition.

2. Background Art

Semiconductor manufacturing, like many types of manufacturing, strives to produce more products faster and at higher quality. Over the years, semiconductor manufacturing has become highly automated and is performed in a series of photolithographic and chemical processing steps. These steps can generally be categorized as wafer processing, die preparation, integrated circuit (IC) packaging and IC testing. Of particular relevance is the step of chemical vapor deposition (CVD) or atomic layer deposition (ALD), which is part of wafer processing.

CVD and ALD are often used to create a thin film on a semiconductor wafer. A gas precursor, often two gas precursors, are released above the substrate surface of the wafer to decompose and/or react on the surface. A growth film can be created by repeatedly exposing the surface to the volatile precursors. With ALD, a purge gas is usually injected between applications of reactant to force the reactive precursor (and/or any byproducts) out of the reaction chamber to ensure nothing unexpected remains in the chamber prior to the next reaction.

Wafers may be processed one at a time or in a batch process. The term single wafer processing generally means that only one wafer at a time is processed at a given step; the term does not typically mean that only one wafer is being manufactured at a time. In contrast, batch processing can be beneficial when one is looking to produce a large number of identical wafers, perhaps for a computer chip to be sold to the general public, such as for a graphics card or a central processing unit. However, batch processing may impose additional constraints, such as the need for parallel machinery to process all of the wafers during a given step.

Wafer manufacturing is concerned with producing results that are uniform and repeatable. This is particularly true for batch manufacturing, because higher volumes are being manufactured and a lack of uniformity may lead to a reduced yield, lowered specifications (to allow for higher variability in manufacturing), and difficulty in ramping up production. Because annual sales of semiconductor chips have risen to $200-300 billion per year and continue to grow, even small improvements to manufacturing uniformity can be quite valuable.

Therefore, a need exists for improved processing of wafers.

SUMMARY

Systems, apparatuses and method embodiments for batch processing of semiconductor wafers are described herein.

In an embodiment, an apparatus comprises a vertical arrangement of wafers configured for batch processing. The wafers include at least a first wafer and a second wafer. An injection module is configured to direct gas parallel to a plane of the first wafer. The injection module has an opening configured such that the gas projected from the opening is dispersed substantially evenly proximate to an edge of the first wafer.

In an embodiment, a method comprises configuring a vertical arrangement of wafers for batch processing. The wafers include at least a first wafer and a second wafer. Gas is projected from an injection module, parallel to a plane of the first wafer, such that the gas disperses substantially evenly proximate to an edge of the first wafer.

Further features and advantages, as well as the structure and operation of various embodiments, are described in detail below with reference to the accompanying drawings. It is noted that the disclosure is not limited to the specific embodiments described herein. Additional embodiments will be apparent to persons skilled in the relevant art based on the teachings contained herein.

BRIEF DESCRIPTION OF THE DRAWINGS/FIGURES

The features and advantages of embodiments of the present invention will become more apparent from the detailed description set forth below when taken in conjunction with the drawings. In the drawings, like reference numbers generally indicate identical, functionally similar, and/or structurally similar elements. The drawing in which an element first appears is indicated by the leftmost digit(s) in the corresponding reference number.

FIG. 5A is a top view of an apparatus for batch wafer manufacturing with a single angled injector, according to an embodiment.

FIG. 6A is an apparatus for batch wafer manufacturing with multiple injectors, according to an embodiment.

FIG. 7A is a top view of an apparatus for batch wafer manufacturing with various injector opening shapes, according to an embodiment.

FIG. 8A is a top view of a cutaway pipe with an injector opening that has a tapered angle, according to an embodiment.

FIG. 8B is a top view of an apparatus similar to FIG. 8A, but with an injector opening that has a rounded edge, according to an embodiment.

FIG. 8C is a top view of an apparatus similar to FIG. 8B, but with an injector opening that has a different rounded edge, according to an embodiment.

FIG. 9B is a perspective view of the apparatus of FIG. 9A.

FIG. 10A is a top view of an apparatus for batch wafer manufacturing with a nozzle, according to an embodiment.

FIG. 11A is a top view of an apparatus for batch wafer manufacturing with multiple pipes and injectors, according to an embodiment.

FIG. 11B is a perspective view of the apparatus of FIG. 11A.

DETAILED DESCRIPTION

One difference between batch processing and single wafer processing is how gas is deposited onto the wafer. In single wafer processing, where one wafer at a time is processed, it may be convenient and effective to inject gas from above the wafer, directed at the center of the wafer, such that the gas disperses as it falls to cover the wafer. However, this is not possible in batch processing, where the wafers are generally in a vertical stack (one way to arrange wafers vertically is to load the wafers into a cassette, also known as a boat. The wafer boat may then be moved around a clean room to allow for processing of the wafers). This vertical arrangement means that the gas injectors must be located outside the stack of wafers, i.e., outside of the boat.

Accordingly, in batch processing, gas is injected from outside the circumference of the wafer boat. However, when doing so, it is unlikely that the gas will evenly and completely cover the wafers. One approach to solve this problem is to spin the wafers during the gas injecting, such that the gas is distributed around the wafer. By rotating the wafers six times, for example, six injections of gas can deposited onto the wafers. Purge gases may be injected in the same manner as reaction gases.

Figure 1:
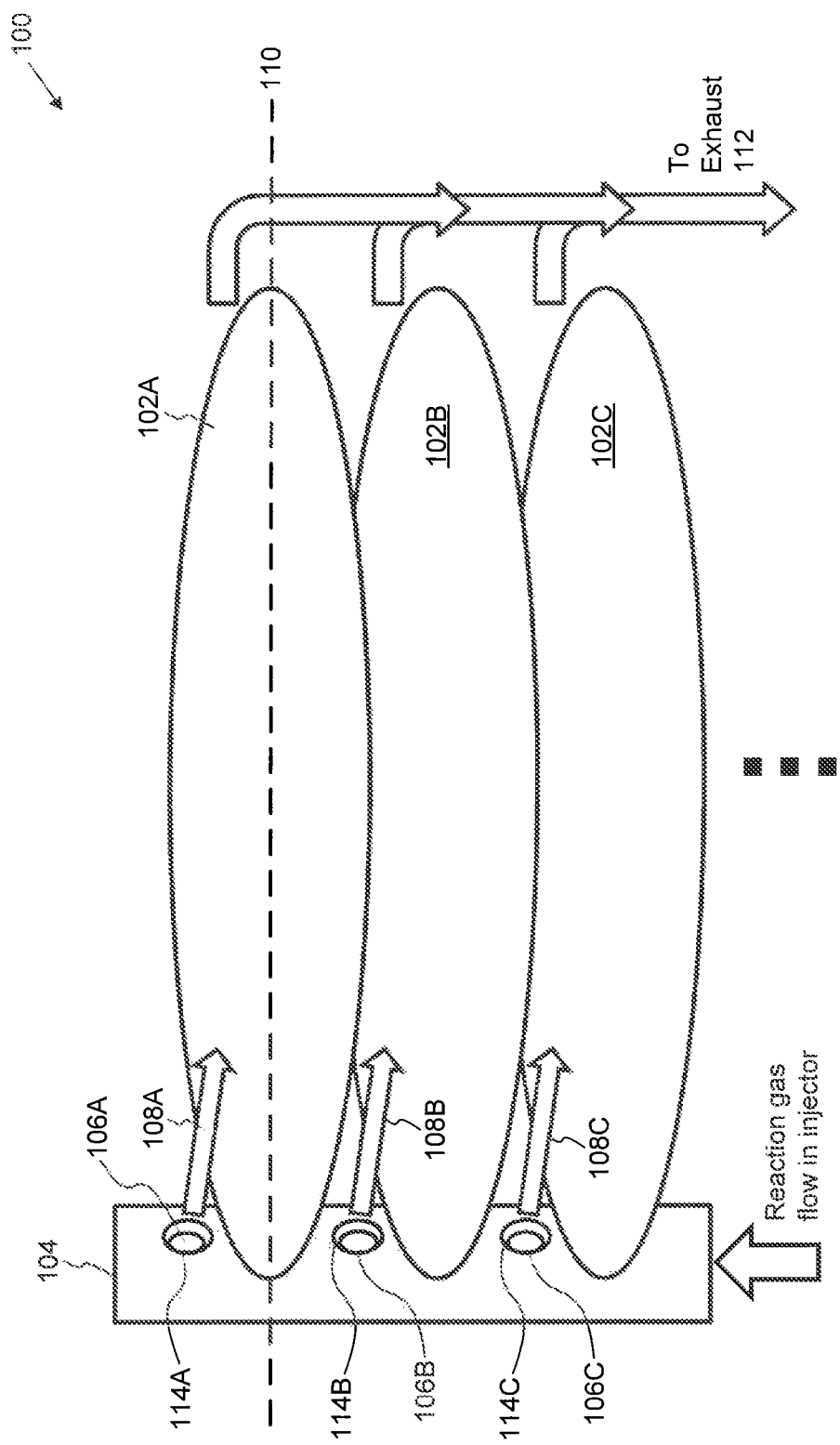
FIG. 1 is a perspective view of an apparatus for batch wafer manufacturing, according to an embodiment.

FIG. 1 depicts a batch processing apparatus 100 for silicon wafers 102. Each wafer 102, which may also be known as a slice or substrate, is often made from silicon crystal. Other wafers 102 may be made from other semiconductor materials, such as gallium arsenide, and combinations such as silicon on insulator. Wafers 102 may be used for purposes other than integrated circuits, such as creating diamonds through chemical vapor deposition. Wafers 102 may be 25.4 millimeters (1 inch)—300 millimeters in diameter, with 450 mm diameter wafers in early testing. The invention is not limited to the above examples.

Apparatus 100 includes a pipe 104 that runs vertically alongside the stack of wafers 102A-C. The pipe 104 has a series of injectors 106A-C. The injectors 106A-C are formed as holes, or openings, in the pipe 104. The pipe 104, or tube, may be formed of quartz (primarily because quartz is impervious to the reaction gases, but also for its strength). The injectors 106 may also be formed of or from quartz.

Gas 108A-C may flow through pipe 104 and injectors 106A-C to exit over the wafers 102A-C. Gas injectors 106A-C may inject the gases 108A-C parallel to a horizontal plane 110 of the wafers 102 (such horizontal plane 110 being parallel to the surfaces of wafers 102) such that the gas 108 falls down onto the wafers 102. Some of the gas 108 may continue across the wafers 102 and down to an exhaust 112.

In the embodiment of FIG. 1, an injector module 114A includes the injector 106A. An injector module 114 establishes the path that the gas 108 takes from the pipe 104 to the wafer 102. In the example of FIG. 1, each injector module 114A-C comprises only respective injectors 106A-C. A more detailed discussion of injector modules 114A-C can be found in the description of the embodiment of FIG. 9A, wherein the injector module 114 includes more than just injector 106.

Figure 2:
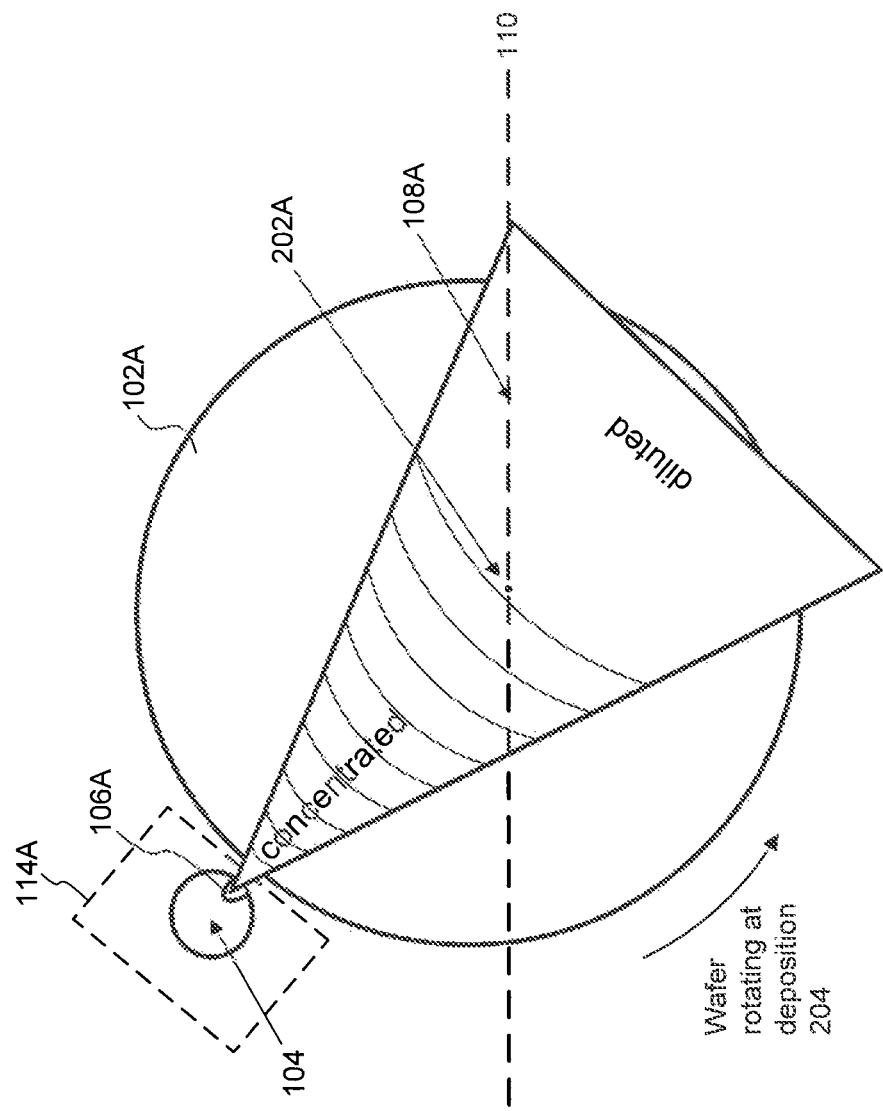
FIG. 2 illustrates an issue with a semiconductor manufacturing apparatus after one injection.

In a first embodiment shown in FIG. 2, the gas injector 106A disperses gas 108A towards the center 202A of the wafer 102A. The gas 108A is dispersed with an angle of approximately 40° relative to the plane 110 of wafer 102A. As depicted, the gas 108A is most concentrated near the injector 106A and dilutes (or disperses) as the gas 108A crosses the wafer 102A.

Figure 3:
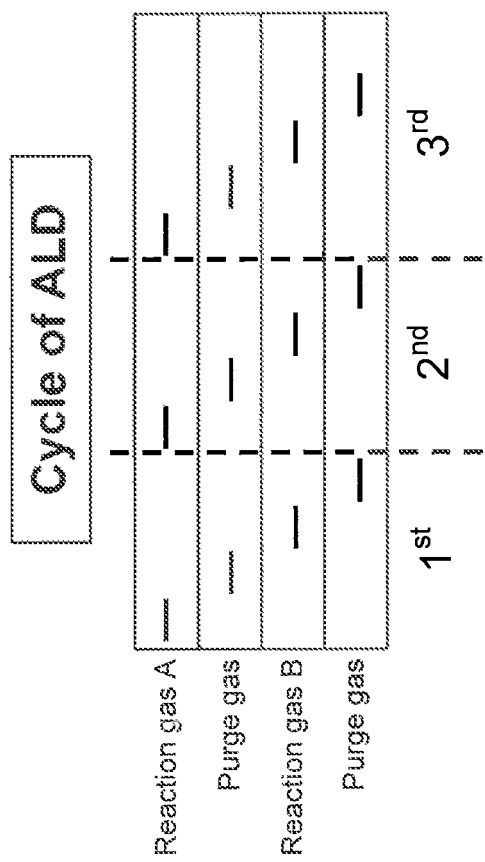
FIG. 3 depicts a timing diagram for injecting gases for batch wafer manufacturing.
Figure 4:
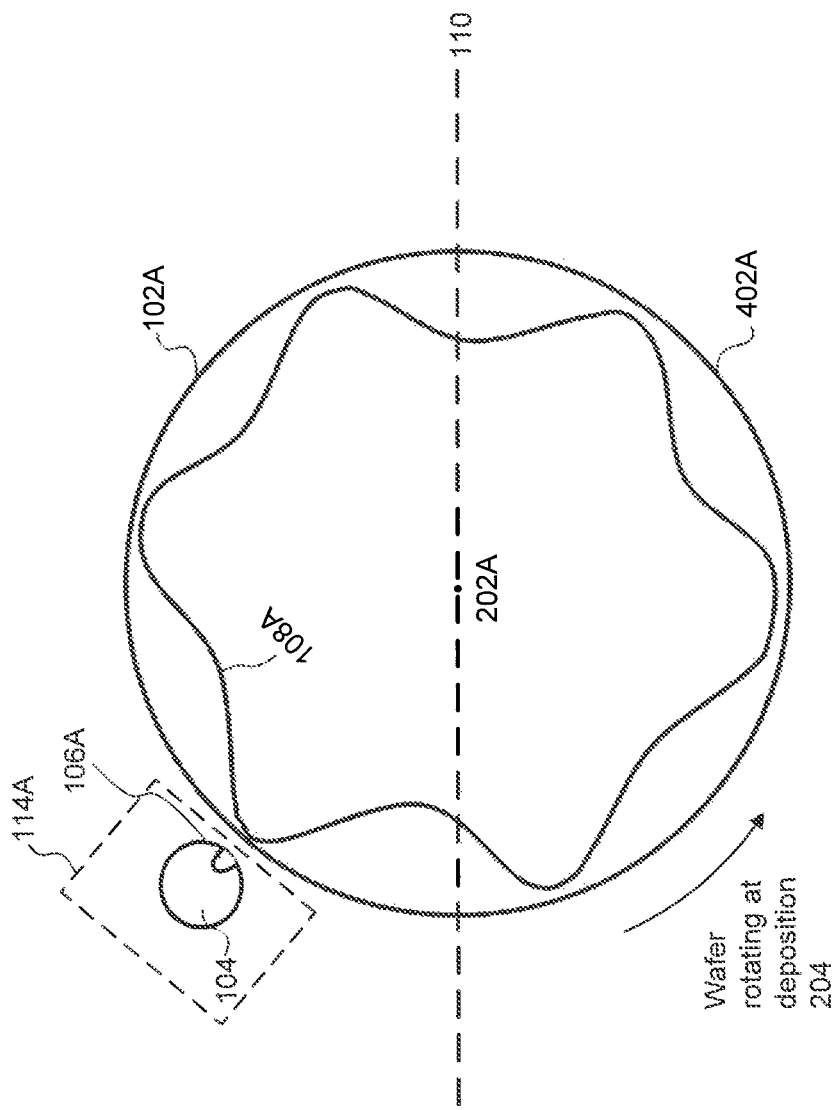
FIG. 4 illustrates an issue with a semiconductor manufacturing apparatus after six injections.

FIG. 3 depicts a timing diagram 302 for injecting gases 108 where batch processing apparatus 100 is an atomic layer deposition apparatus. Vertical dashed lines separate each cycle, labeled $1^{st}$, $2^{nd}$ and $3^{rd}$. As discussed below, FIG. 4 shows the gas distribution over wafer 102A after six cycles. FIG. 3 depicts that the $1^{st}$ cycle is divided into four parts, where reaction gas A is released into the chamber, followed by purge gas, then gas B, and so forth. As depicted, the process repeats each cycle.

Atomic layer deposition (ALD) is a process to deposit conformal thin films onto a surface, such as a wafer 102. ALD deposits films by repeatedly exposing a growth surface to precursors. Because ALD deposits a set amount of material for each reaction, ALD is self-limiting. ALD is similar to chemical vapor deposition, except that ALD exposes the surface to precursors one at a time, i.e., it breaks a reaction in half. Keeping precursors separate allows for a thinner film to be deposited. ALD separates the precursors by using a purge gas in between the precursors. ALD is sometimes known as "molecular layering."

FIG. 4 depicts a second embodiment for dispersing gas 108 to wafers 102. In FIG. 4, the injector 106A has injected gas 108A six times (per timing diagram 302), such that the six injections have overlapped each other as the gas 108A from each injection settled on the wafer 102A. The sum of the settled gas 108A has formed a six pointed gas blob on the wafer 102A. In this embodiment, gas 108A was injected a first time, and then the wafer 102A was rotated, and this was repeated 5 more times. In FIG. 4, gas 108A was dispersed with an angle of approximately 90° along the plane 110 of wafer 102A. As also depicted in FIG. 4, the settled gas 108A is more concentrated towards the edge 402A of wafer 102A than at the center 202A of wafer 102A. However, there is area near the edge 402A that has not been exposed to gas 108A. In sum, the embodiments of FIGS. 2 and 4 do not result in full and even coverage of gas 108 on wafers 102. In the following, additional embodiments are described that solve these shortcomings and result in more even and complete gas 108 dispersal over wafers 102.

FIG. 5A depicts an embodiment similar to FIG. 2. In FIG. 5A, however, the injector 106A is angled away from the center 202A of the wafer 102A. One advantage of directing the injector 106A away from the center 202A and towards the edge 402A of the wafer 102A is that the gaps in gas dispersion seen in FIG. 4 are more likely to be mitigated.

Figure 5B:
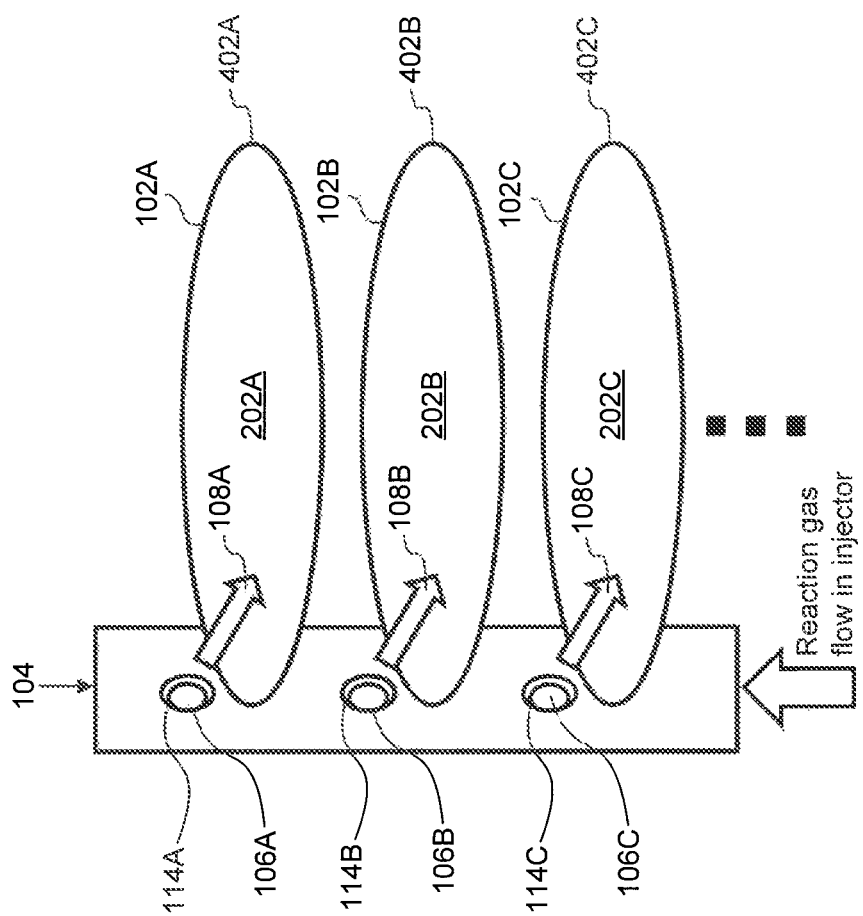
FIG. 5B is a perspective view of the apparatus of FIG. 5A.

FIG. 5B illustrates how the techniques of FIG. 5A may be applied to a vertical arrangement of wafers 102 (e.g., wafers 102A-C). FIG. 5B shows that one or more injectors 106 (e.g., injectors 106A-C) may be angled towards respective edges 402 (e.g., edges 402A-C) either by rotating the pipe 104 (e.g., installing the pipe 104 such that the injectors 106 (e.g., injectors 106A-C) are at the specified angle relative to the centers 202 (e.g., centers 202A-C) of the wafers 102), or by building the injectors 106 such that the injectors 106 are angled away from the centers 202 when the pipe is installed in a standard fashion.

FIG. 6A depicts another embodiment to disperse gas 108 over a wafer 102A. FIG. 6A depicts two injectors 106A1 and 106A2 that direct gas over wafer 102A. In some embodiments, a similar amount of gas 108 is collectively projected through the two injectors 106A1 and 106A2 as would have been delivered through a single injector 106A (see, for example, FIG. 5A). In the embodiment of FIG. 6A, gas 108A may not travel as far across wafer 102A relative to the embodiment of FIG. 2 because there is less gas 108A to disperse through each injector 106A1, 106A2, or because there is less pressure on the gas 108A (as the combined size of the injector openings is larger). In an embodiment, the injector 106 can be formed as two or more holes, such as a horizontal line of small holes on pipe 104, to release gas 108A.

Figure 6B:
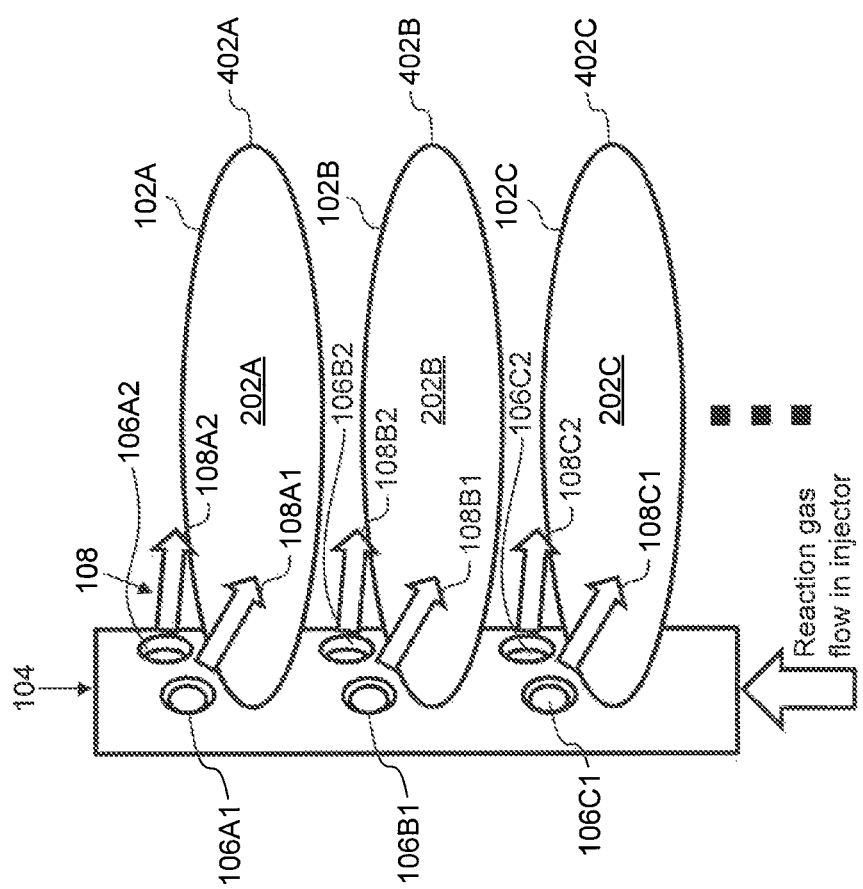
FIG. 6B is a perspective view of the apparatus of FIG. 6A.

FIG. 6B illustrates how the technique of FIG. 6A may be applied to a vertical arrangement of wafers 102. For example, FIG. 6B illustrates an exemplary embodiment including a vertical arrangement of wafers 102A-102C. In this embodiment, injectors 106A1-A2, injectors 106B1-B2, and injectors 106C1-C2 direct respective gases 108A1-A2, gases 108B1-B2, and gases 108C1-C2 over respective wafers 102A-C.

Figure 7B:
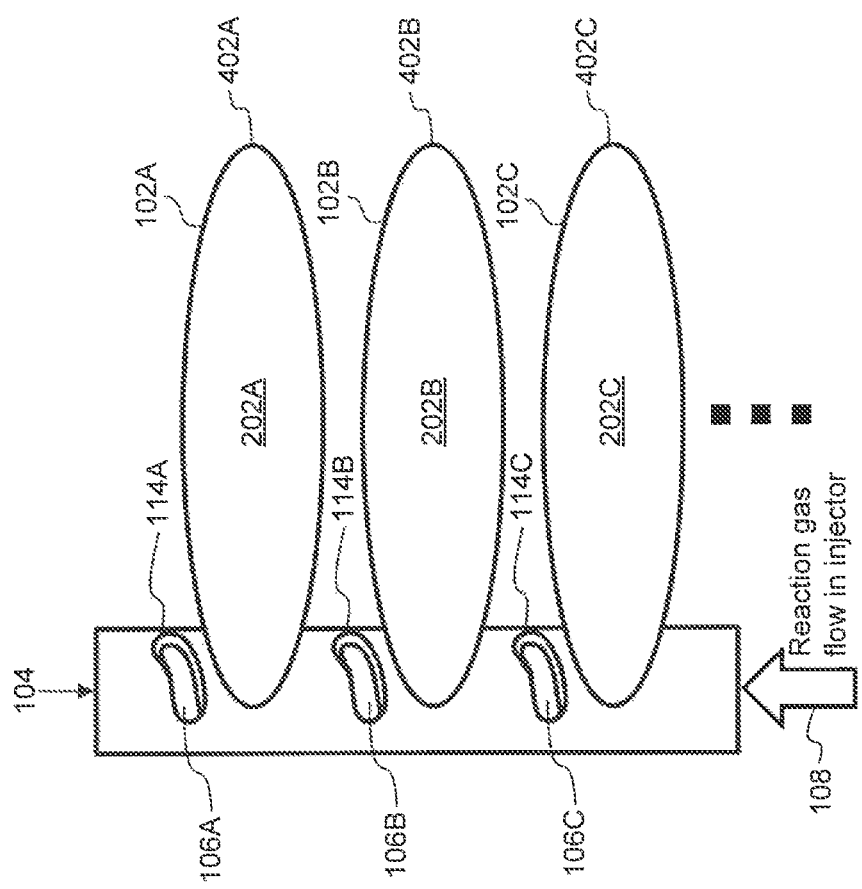
FIG. 7B is a perspective view of the apparatus of FIG. 7A.

FIG. 7A depicts another embodiment, wherein injector 106A has an oval opening or a rectangular opening, as opposed to the circular openings illustrated in FIG. 1. One advantage of either an oval or a rectangular shaped opening is that either, if placed with the long side parallel to plane 110, allows gas 108A to escape such that it more evenly distributes over the wafer 102A because the gas 108A exits the injector 106A with a wider, or more obtuse, angle. FIG. 7B illustrates how the technique of FIG. 7A may be applied to a vertical arrangement of wafers 102.

FIGS. 8A-8C show embodiments of the injector 106. In particular, FIG. 8A is a top view of a cutaway of the pipe 104 and the injector 106A. FIG. 8A uses dotted lines 802 to indicate the gas projection angle of injector 106 of FIG. 2 (wafer 102A, while not drawn to scale, is shown to depict the angle of projection of injector 106).

Tapered angle 804 in FIG. 8A illustrates how an injector opening may be modified to alter the shape or direction of dispersed gas 108. In the embodiment of FIG. 8A, the tapering is approximately 45°.

In the embodiment of FIG. 8B, the injector 106A has a rounded edge 806. A rounded edge 806 may have a similar effect on gas 108A dispersion as a directed angle 804. In particular, rounded edge 806 may curve through, for example, a half circle, as in FIG. 8B, or a quarter circle, as in FIG. 8C.

Figure 9A:
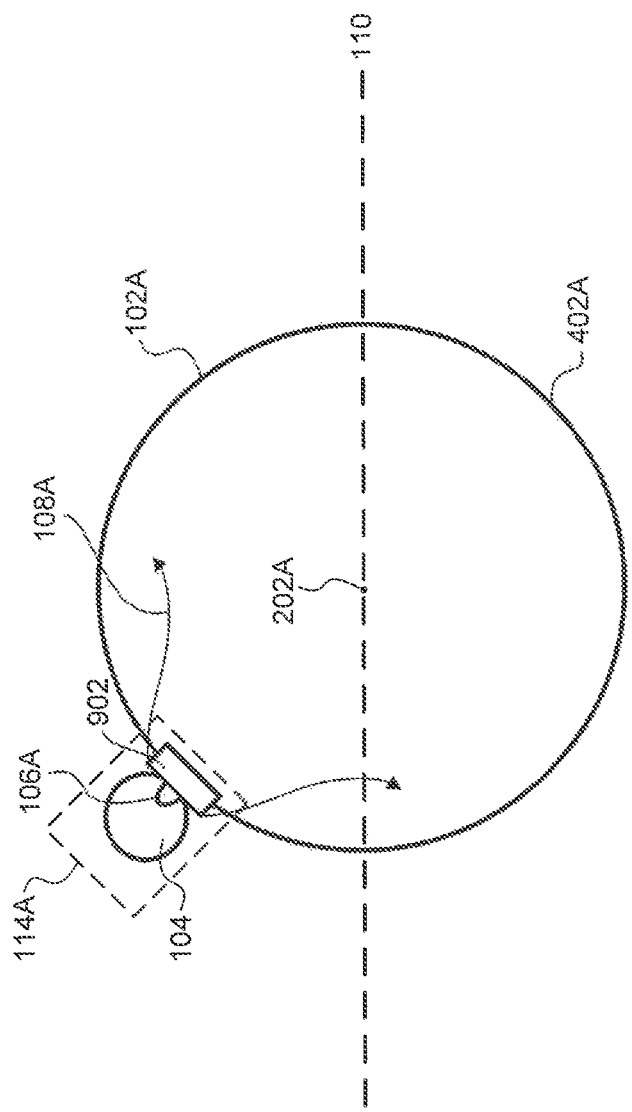
FIG. 9A is a top view of an apparatus for batch wafer manufacturing with a rectification wing, according to an embodiment.

FIG. 9A illustrates another embodiment where the injector module 114A includes the injector 106A and a rectification wing 902. The injector 106A is coupled to the rectification wing 902 to disperse gas 108A over wafer 102A. According to the embodiment of FIG. 9A, gas 108A follows a path from the pipe 104 through the injector 106A, contacts the rectification wing 902, and then settles on the wafer 102A. The rectification wing 902 is a deflector because it serves to deflect at least some of the gas 108A after exiting injector 106A. In certain embodiments, the rectification wing 902 is configured to deflect all of the gas 108A from the injector 106A. In other embodiments, the rectification wing 902 is configured to deflect a portion of the gas 108A from the injector 106A. In certain embodiments, where there is more than one injector 106 (as shown in FIGS. 6A and 6B, for example), there may be symmetric rectification wings 902 for each injector 106A1 and 106A2. In other embodiments, there may be a rectification wing 902 for one injector 106A1 but not for another injector 106A2. Rectification wings 902 may be made from materials, such as quartz, that are commonly used to manufacture pipes 104 or other components with the appropriate strength and inertness.

FIG. 9B illustrates how the technique of FIG. 9A may be applied to a vertical arrangement of wafers 102A-C. In this embodiment, the injector modules 114A-C include respective rectification wings 902A-C that are placed off center, relative to the injectors 106A-C, in order to direct more gas 108 towards the edges 402A-C of the wafers 102A-C in the opposite direction from the rectification wings 902A-C. Each of the rectification wings 902A-C are identical and have been placed identically. In other embodiments, rectification wings 902A-C may be placed differently, or made from different materials.

Figure 9C:
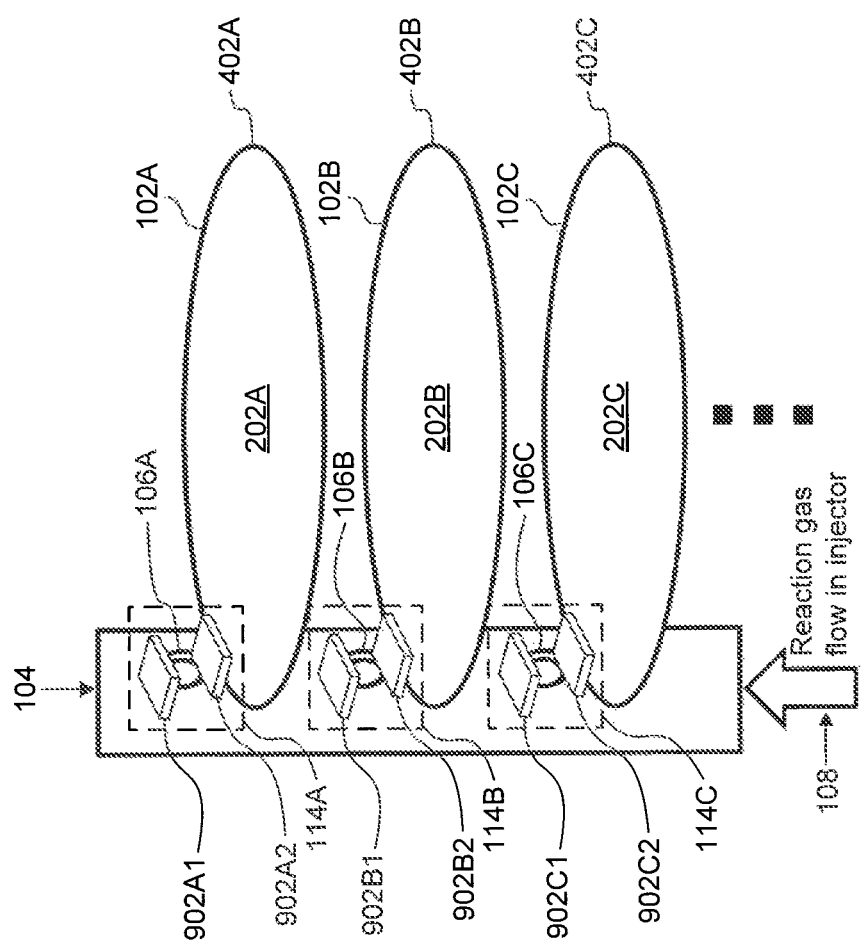
FIG. 9C is a perspective view of an apparatus similar to FIG. 9B, but with two rectification wings per wafer, according to an embodiment.

FIG. 9C illustrates a different way that the technique of FIG. 9A may be applied to a vertical arrangement of wafers 102A-C. In FIG. 9C, the injector modules 114A-C each comprises two rectification wings 902 (e.g., rectification wings 902A1-A2, 902B1-B2, and 902C1-C2). The rectification wings 902 (e.g., rectification wings 902A1 and 902A2) are installed symmetrically to each other, relative to their respective injector 106 (e.g., injector 106A), though this may be different in other embodiments. One advantage to non-symmetric rectification wings 114 is that each of two rectification wings 114 may direct gas 108 in different directions.

Figure 10B:
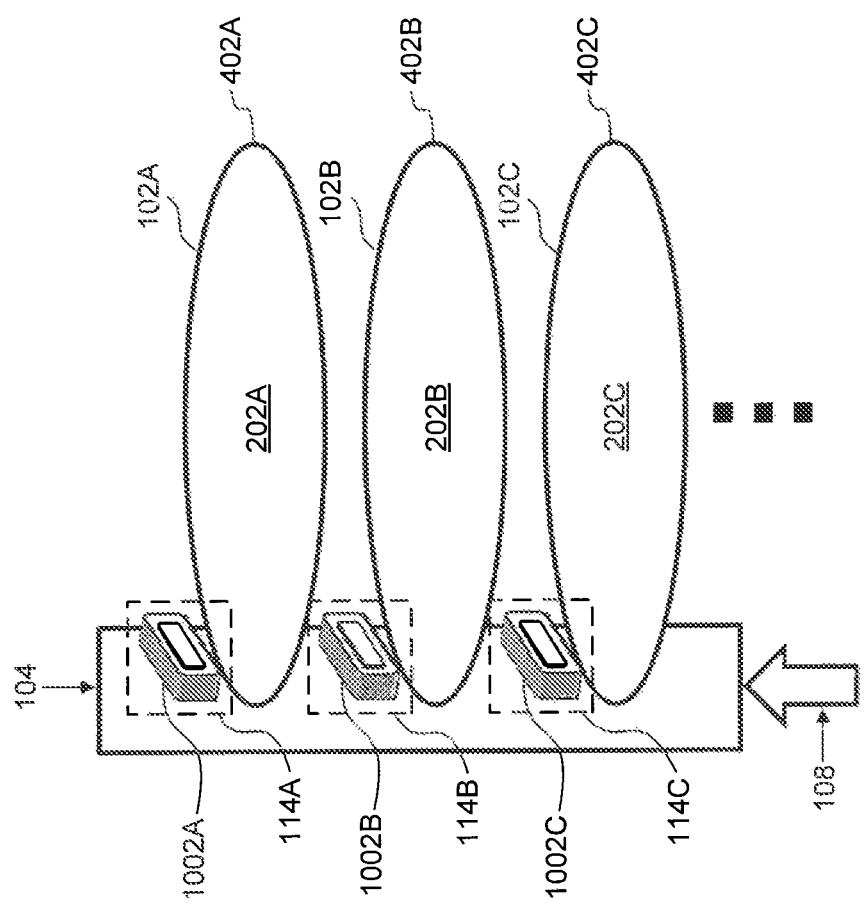
FIG. 10B is a perspective view of the apparatus of FIG. 10A.

FIG. 10A illustrates an embodiment wherein an injector 106 is coupled to a nozzle 1002, for example, injector 106A coupled to nozzle 1002A. Nozzle 1002 may be a jet, laminar, spray or other device that directs, or forms, a spray. In certain embodiments, nozzles 1002 (e.g., nozzles 1002A-C) may be made from materials, such as quartz, that are commonly used to manufacture pipes 104 or other components with the appropriate strength and inertness. In certain embodiments, multiple injectors 106 may have identical nozzles 1002, as illustrated in FIG. 10B, or different injectors 106 may have different nozzles 1002.

FIG. 11A illustrates an embodiment with two pipes 104A and 104B, each with respective injector modules 114A1 and 114 A2 comprising respective injectors 106A1 and 106A2.

In the embodiment of FIG. 11A, wafer 102A is rotated when gases 108A1 and 108A2 are projected from injectors 106A1 and 106A2, respectively. By rotating the wafer 102A while simultaneously projecting gases 108A1 and 108A2, it is possible to achieve overlap of the gas over the wafer.

Two injectors 106A1 and 106A2 in two pipes 104 allow gas dispersal over a wafer 102 with less need for wafer rotation.

FIG. 11B illustrates how the technique of FIG. 11A may be applied to a vertical arrangement of wafers 102. For example, FIG. 11B illustrates an exemplary embodiment including a vertical arrangement of wafers 102A-102C. In this embodiment, injector modules 114A1, 114A2, 114B1, 114B2, 114C1, and 114C2 include injectors 106A1, 106A2, 106B1, 106B2, 106C1, and 106C2, respectively. In operation, injectors 106A1 and 106A2 direct respective gases 108A1 and 108A2 over wafer 102A, injectors 106B1 and 106B2 direct respective gases 108B1 and 108B2 over wafer 102B, and injectors 106C1 and 106C2 direct respective gases 108C1 and 108C2 over wafer 102C. In one embodiment, pipes 104A and 104B may each carry as much gas 108 as the pipe 104 in FIG. 2. In another embodiment, each pipe 104A and 104B may carry half as much gas 108 as in FIG. 2 (half as much because there are two pipes 104A and 104B, but the same amount of gas 108). Other embodiments may use three or more pipes 104.

Figure 12:
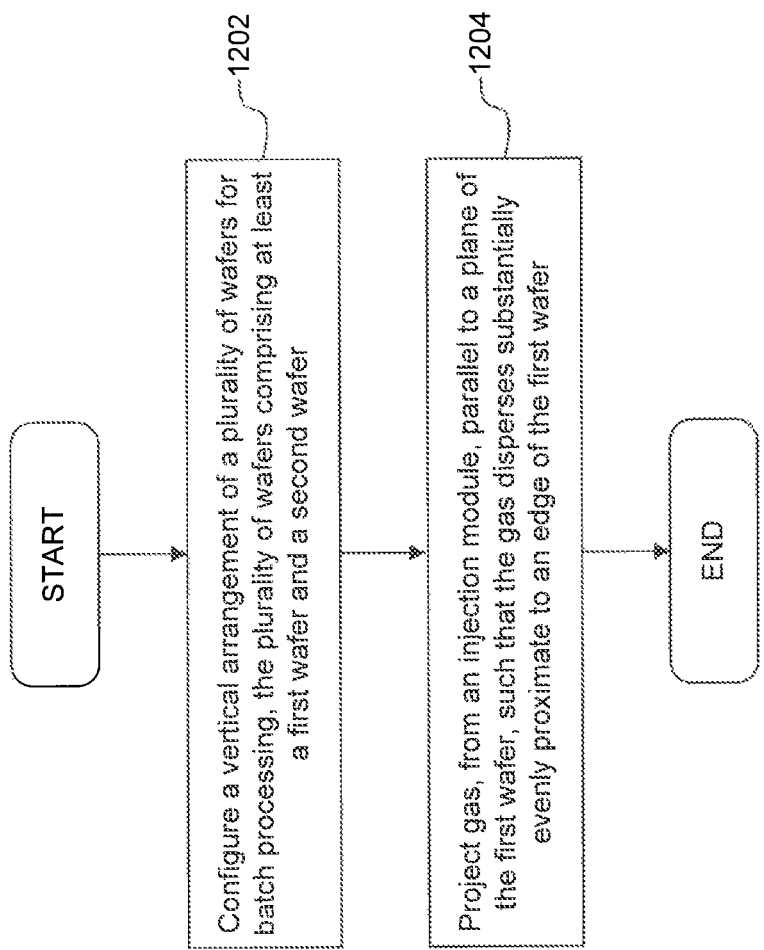
FIG. 12 is a flowchart of a method for batch wafer manufacturing, according to an embodiment.

FIG. 12 illustrates an exemplary method 1200 to disperse gas 108 over semiconductor wafers 102 in batch processing.

In step 1202, a vertical arrangement of wafers 102 is configured for batch processing.

In step 1204, gas 108 is projected to the wafers 102. The gas 108 is projected from injection modules 114, parallel to a plane of the wafers 102, such that the gas 108 disperses substantially evenly proximate to an edge 402 of the wafers 102.

Any of the embodiments disclosed herein may be combined with one another. For example, the multiple injectors 106 of FIG. 11A may be combined with the nozzles 1002 of FIG. 10A. In another embodiment, the nozzles 1002 of FIG. 10A may be combined with the rectification wings 902 of FIG. 9A. In another embodiment, a nozzle 1002 may be provided with a rectangular opening. In a variation of FIG. 7A, an injector 106 may have an opening that is partially rectangular and partially oval. For example, a non-symmetric opening (such as a semicircle opening integrally coupled to an oval or rectangular opening) may allow an injector 106 to disperse gas 108 in a manner that provides a higher proportion of the gas 108 to land near the edge 402 of the wafer 102 than would otherwise. Further, two or more embodiments may be combined. For example, one apparatus 100 may employ an angled injector 106, as in FIG. 5A, with a tapered angle 804, as in FIG. 8, such that at least part of the gas 108 will be redirected by a rectification wing 902.

It is to be appreciated that the Detailed Description section, and not the Summary and Abstract sections, is intended to be used to interpret the claims. The Summary and Abstract sections can set forth one or more but not all exemplary embodiments as contemplated by the inventors, and thus, are not intended to limit the appended claims in any way.

Embodiments have been described above with the aid of functional building blocks illustrating the implementation of specified functions and relationships thereof. Alternate boundaries can be defined so long as the specified functions and relationships thereof are appropriately performed.

The breadth and scope of the present disclosure should not be limited by any of the above-described exemplary embodiments, but should be defined only in accordance with the following claims and their equivalents.

What is claimed is:

1. An apparatus for injecting gas onto a wafer, the apparatus comprising:
   an arrangement comprising a plurality of wafers configured for batch processing;
   a plurality of injectors, wherein an outlet of each injector of the plurality of injectors is aligned with a plane of a corresponding wafer of the plurality of wafers and is configured to direct a corresponding portion of a gas substantially parallel to the plane of the corresponding wafer; and
   a plurality of rectification wings, wherein:
      each pair of rectification wings from among the plurality of rectification wings is coupled to a corresponding injector of the plurality of injectors and is configured to deflect the corresponding portion of the gas away from a center of the corresponding wafer;
      at least one rectification wing from among the plurality of rectification wings extends along the plane of the corresponding wafer and overlaps at least a portion of the corresponding wafer; and
      the outlet of each injector of the plurality of injectors is interposed between a corresponding pair of rectification wings from among the plurality of rectification wings.

2. The apparatus of claim 1, wherein a first rectification wing and a second rectification wing of the each pair of rectification wings are symmetrically arranged with respect to each other.

3. The apparatus of claim 2, wherein the each pair of rectification wings from among the plurality of rectification wings is positioned off center with respect to a center of the corresponding injector of the plurality of injectors.

4. The apparatus of claim 1, wherein the apparatus is configured to perform at least one of atomic layer deposition and molecular layer deposition.

5. The apparatus of claim 1, further comprising a motor configured to spin at least one wafer of the plurality of wafers.

6. The apparatus of claim 1, wherein an injector of the plurality of injectors comprises an opening having a tapered angle or a rounded edge.

7. The apparatus of claim 1, further comprising: a plurality of nozzles, wherein each nozzle of the plurality of nozzles is coupled to the corresponding injector of the plurality of injectors and is configured to direct the corresponding portion of the gas substantially parallel to the plane of the corresponding wafer.

8. The apparatus of claim 1, wherein an injector of the plurality of injectors comprises a non-symmetric opening.

9. The apparatus of claim 8, wherein the non-symmetric opening includes an oval-shaped portion.

10. The apparatus of claim 8, wherein the non-symmetric opening includes a rectangular-shaped portion.

11. The apparatus of claim 1, wherein the arrangement comprises a vertical arrangement of the plurality of wafers and the plurality of injectors.

12. The apparatus of claim 1, wherein the outlet of each injector of the plurality of injectors is configured to disperse the corresponding gas portion substantially evenly proximate to an edge of the plane of the corresponding wafer.

13. The apparatus of claim 1, wherein the each pair of rectification wings from among the plurality of rectification wings is configured to direct the corresponding portion of the gas towards the edge of the plane of the corresponding wafer.

* * * * *